(12) United States Patent
Obata

(10) Patent No.: US 10,797,644 B2
(45) Date of Patent: Oct. 6, 2020

(54) OSCILLATOR, ELECTRONIC APPARATUS, AND VEHICLE

(71) Applicant: SEIKO EPSON CORPORATION, Tokyo (JP)

(72) Inventor: Naohisa Obata, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/286,738

(22) Filed: Feb. 27, 2019

(65) Prior Publication Data

US 2019/0267940 A1 Aug. 29, 2019

(30) Foreign Application Priority Data

Feb. 28, 2018 (JP) ................................ 2018-035891

(51) Int. Cl.
*H03B 5/04* (2006.01)
*H03B 5/36* (2006.01)
*H03L 1/02* (2006.01)
*H03L 1/04* (2006.01)
*H03H 9/05* (2006.01)

(52) U.S. Cl.
CPC ................ *H03B 5/04* (2013.01); *H03B 5/36* (2013.01); *H03H 9/0547* (2013.01); *H03H 9/0552* (2013.01); *H03L 1/028* (2013.01); *H03L 1/04* (2013.01)

(58) Field of Classification Search
CPC .... H03B 5/04; H03B 5/02; H03B 5/32; H03L 1/028; H03L 1/02; H03L 1/04; H03H 9/02102; H03H 9/17; H03H 9/19; H03H 9/02448; H03H 9/0547; H03H 9/0552; H03H 9/08; H03H 9/0514; H03H 9/0557
See application file for complete search history.

(56) References Cited

U.S. PATENT DOCUMENTS

| | | | |
|---|---|---|---|
| 7,484,279 B2* | 2/2009 | Aoki | H03H 9/0547 29/25.35 |
| 8,085,105 B2* | 12/2011 | Kasahara | H03B 1/02 331/176 |
| 8,941,444 B2* | 1/2015 | Asamura | H03B 5/364 331/108 C |

(Continued)

FOREIGN PATENT DOCUMENTS

| | | |
|---|---|---|
| JP | 4804813 B2 | 11/2011 |
| JP | 2016-103758 A | 6/2016 |
| WO | 2017/110727 A1 | 6/2017 |

*Primary Examiner* — Ryan Johnson
(74) *Attorney, Agent, or Firm* — Oliff PLC

(57) ABSTRACT

An oscillator includes a resonation element, a first package that houses the resonation element and airtightly sealed, a circuit element that is positioned outside the first package and electrically connected to the resonation element, and a second package that houses the first package and the circuit element and sealed in a depressurized state. In addition, the first package includes a first base having a first recessed portion, and a first lid joined to the first base so as to close an opening of the first recessed portion, and the second package includes a second base having a second recessed portion and a second lid joined to the second base so as to close an opening of the second recessed portion. The circuit element is attached to the first base, and the first base is attached to the second base.

9 Claims, 9 Drawing Sheets

(56) References Cited

U.S. PATENT DOCUMENTS

| | | | |
|---|---|---|---|
| 2006/0290239 A1 | 12/2006 | Kasahara et al. | |
| 2015/0162521 A1* | 6/2015 | Kojo | H03B 5/364 |
| | | | 310/344 |
| 2015/0381184 A1* | 12/2015 | Suzuki | H03B 5/04 |
| | | | 331/156 |
| 2017/0272081 A1* | 9/2017 | Chiang | H03L 1/02 |

* cited by examiner

OSCILLATOR, ELECTRONIC APPARATUS, AND VEHICLE

BACKGROUND

1. Technical Field

The present invention relates to an oscillator, an electronic apparatus, and a vehicle.

2. Related Art

In related art, an oscillator using a quartz crystal resonation element is known. For example, In the oscillator described in International Publication No. 2017/110727 includes a substrate, a resonation element and a circuit element attached side by side on the upper surface of the substrate, a first cap joined to the substrate so as to cover the resonation elements and the circuit elements and a second cap joined to the substrate so as to cover the first cap.

In such an oscillator of International Publication No. 2017/110727, as described above, since the resonation element and the circuit element are attached to the substrate, heat from the outside is easily transmitted to the resonation element and the circuit element. That is, it is susceptible to the influence of environmental temperature, and the temperature of the resonation element and the circuit element is not stable. For this reason, for example, in a case where the oscillator of International Publication No. 2017/110727 is used as a temperature compensated oscillator, there is a problem that the temperature compensation function of the oscillator deteriorates.

SUMMARY

An oscillator according to an application example of the invention includes a resonation element, a first package that houses the resonation element and is airtightly sealed, a circuit element that is positioned outside the first package and electrically connected to the resonation element and has an oscillation circuit and a temperature compensation circuit, and a second package that houses the first package and the circuit element and is sealed in a depressurized state, in which the first package includes a first base that has two first main surfaces and a first recessed portion that is provided on one of the first main surfaces, and a first lid that is joined to the first base so as to close an opening of the first recessed portion, and the second package includes a second base that has two second main surfaces and a second recessed portion that is provided on one of the second main surfaces, and a second lid that is joined to the second base so as to close an opening of the second recessed portion, the circuit element is attached to the first base, and the first base is attached to the second base.

It is preferable that the oscillator according to the application example of the invention further includes a first metal bump that joins the circuit element and the first base and electrically connects the circuit element and the first package.

It is preferable that the oscillator according to the application example of the invention further includes a joining member that joins the circuit element and the first base, and a bonding wire that electrically connects the circuit element and the first package.

In the oscillator according to the application example of the invention, it is preferable that the second package includes an internal terminal that is disposed so as to face an inside of the second recessed portion and an external terminal that is disposed on the other second main surface of the second base and electrically connected to the internal terminal.

It is preferable that the oscillator according to the application example of the invention further includes a second metal bump that joins the first base and the second base and electrically connects the first package and the internal terminal.

In the oscillator according to the application example of the invention, it is preferable that the circuit element is disposed between a bottom surface of the second recessed portion and the first base.

In the oscillator according to the application example of the invention, it is preferable that the second recessed portion includes a primary second recessed portion, and a secondary second recessed portion that opens on a bottom surface of the primary second recessed portion, the first base is attached to the bottom surface of the primary second recessed portion, and the circuit element is positioned between the first base and a bottom surface of the secondary second recessed portion.

In the oscillator according to the application example of the invention, it is preferable that an inside of the first package is filled with an inert gas.

An electronic apparatus according to an application example of the invention includes the oscillator of the application example.

A vehicle according to an application example of the invention includes the oscillator of the application example.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an oscillator, an electronic apparatus, and a vehicle according to the invention will be described in detail based on embodiments shown in the accompanying drawings.

First Embodiment

First, an oscillator according to a first embodiment of the invention will be described.

Figure 1:
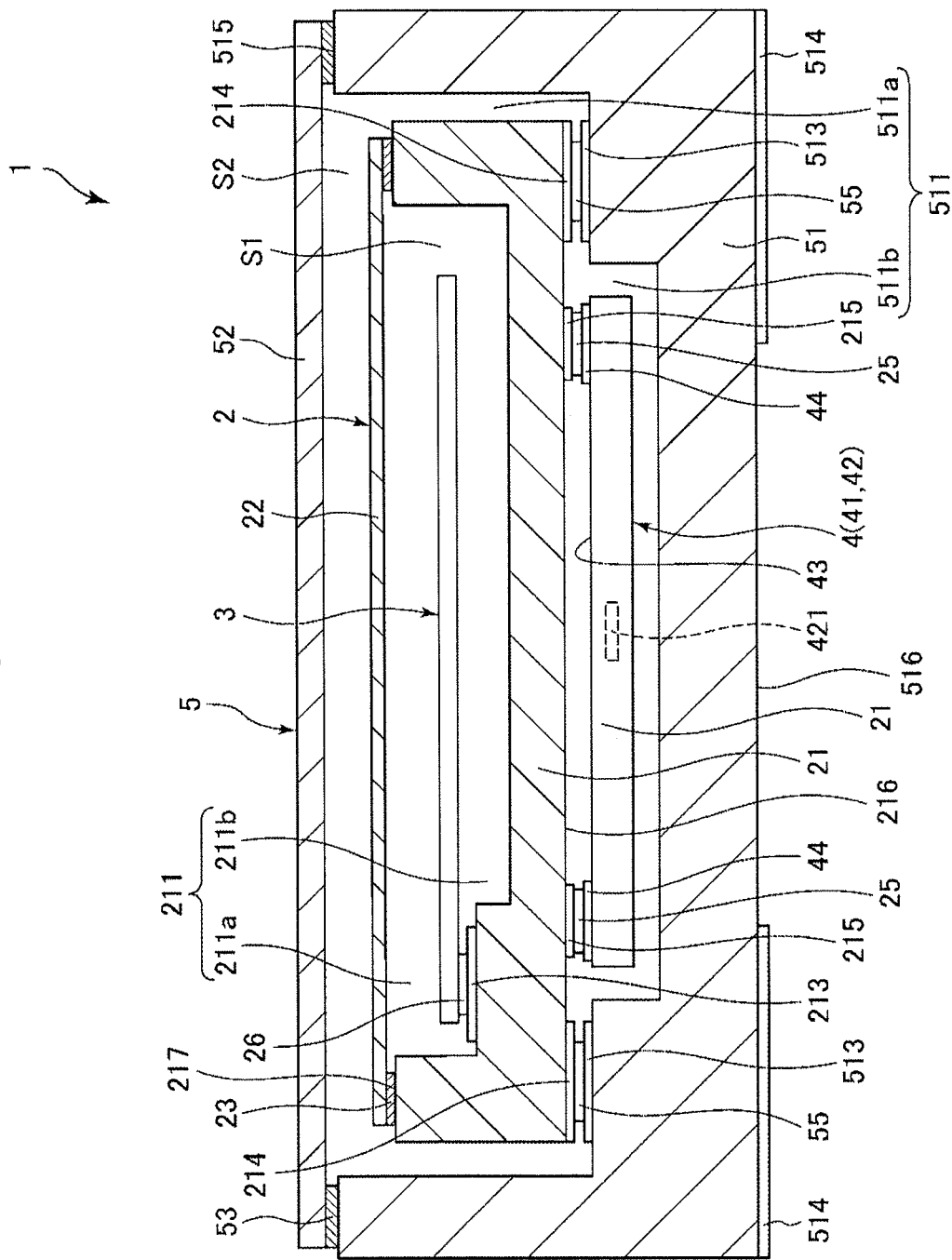
FIG. 1 is a cross-sectional view of an oscillator according to a first embodiment of the invention.
Figure 2:
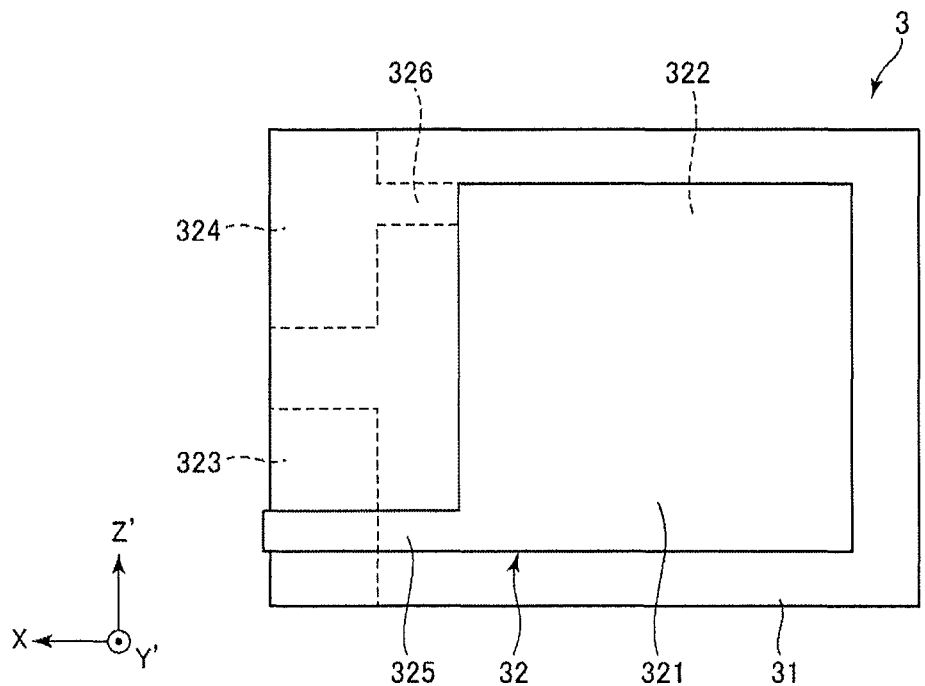
FIG. 2 is a plan view of a resonation element included in the oscillator shown in FIG. 1.
Figure 3:
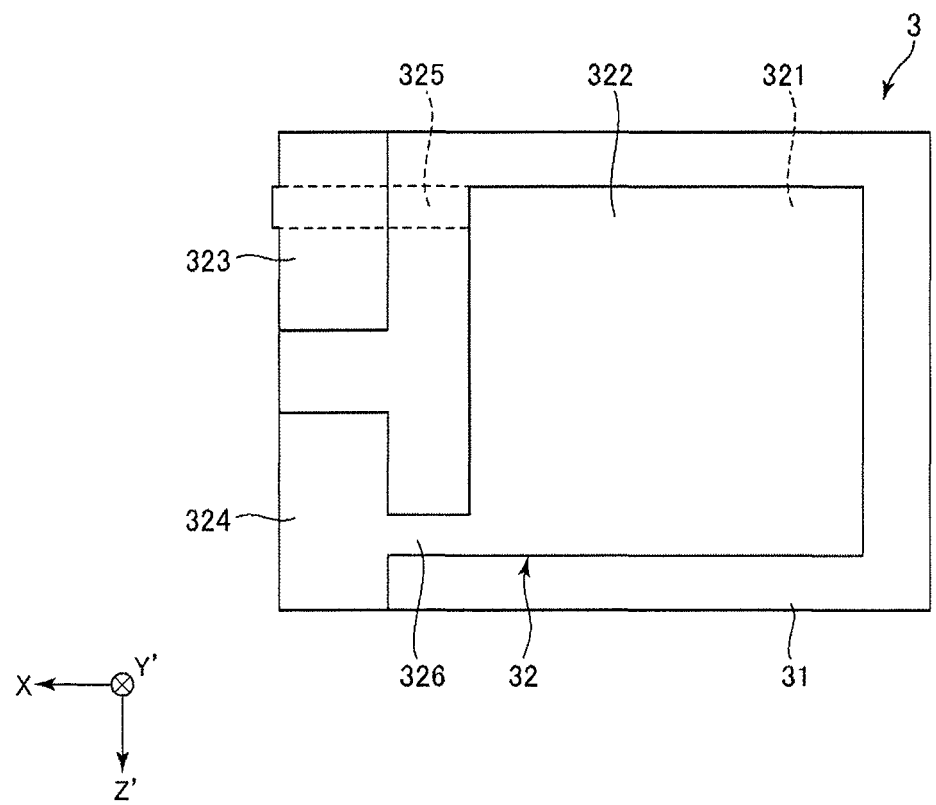
FIG. 3 is a plan view of the resonation element included in the oscillator shown in FIG. 1.
Figure 4:
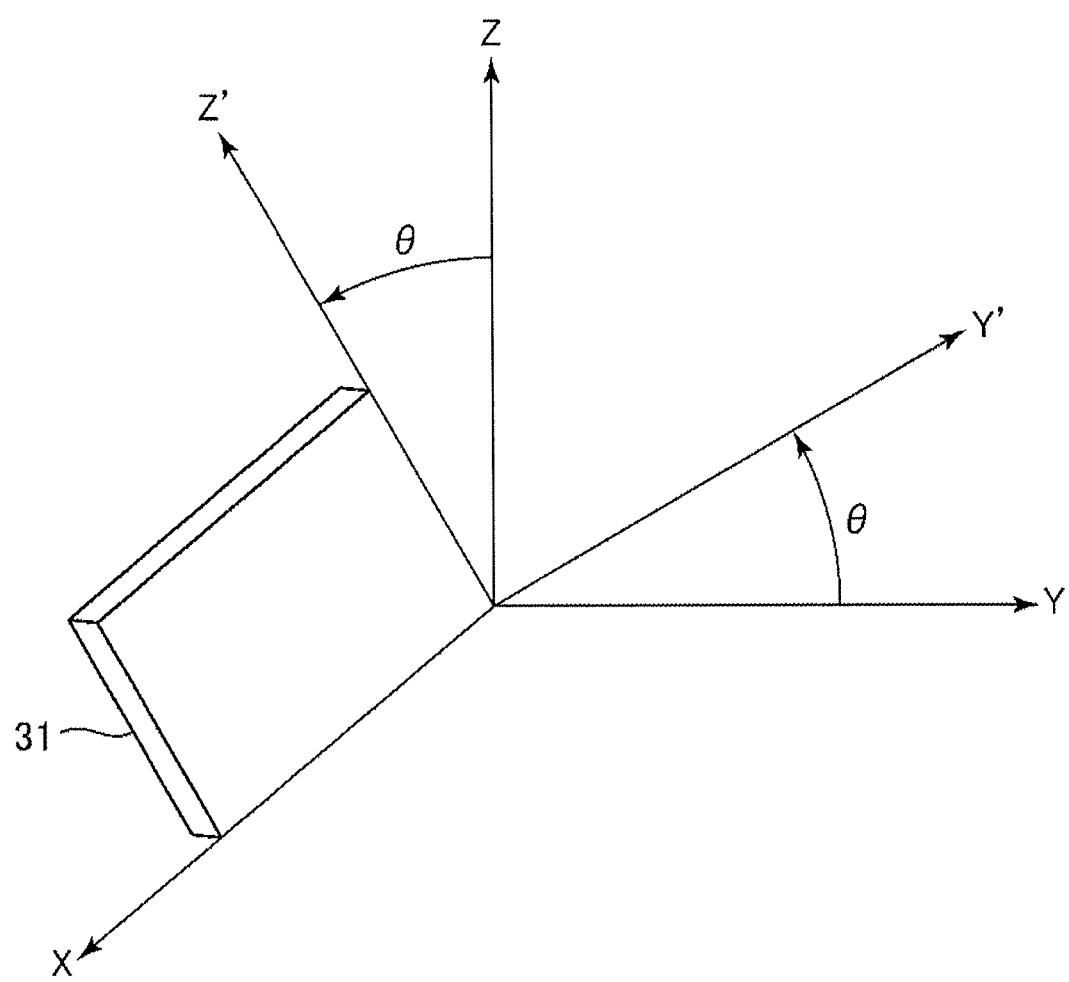
FIG. 4 is a diagram for describing a relationship between an AT-cut quartz crystal substrate and a crystal axis of quartz crystal.
Figure 5:
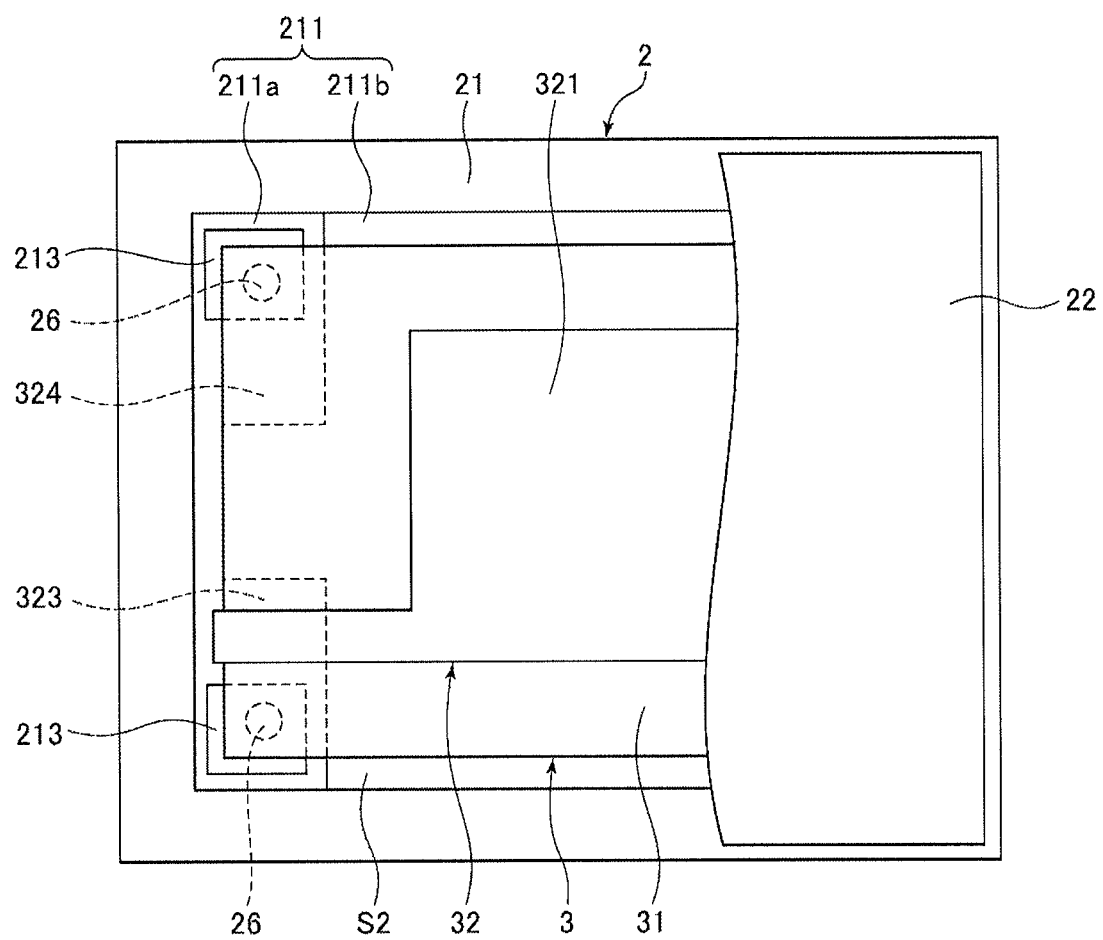
FIG. 5 is a top view showing the inside of the inner package of the oscillator shown in FIG. 1.

FIG. 1 is a cross-sectional view of the oscillator according to the first embodiment of the invention. FIGS. 2 and 3 are plan views of a resonation element included in the oscillator shown in FIG. 1, respectively. FIG. 4 is a diagram for describing a relationship between an AT-cut quartz crystal substrate and a crystal axis of quartz crystal. FIG. 5 is a top view showing the inside of the inner package of the oscillator shown in FIG. 1. Hereinafter, for convenience of description, the upper side in FIG. 1 is also referred to as "upper" and the lower side is also referred to as "lower". In addition, hereinafter, for convenience of description, the plan view when FIG. 1 is viewed from the upper side is simply referred to as "plan view".

An oscillator 1 shown in FIG. 1 is an oscillator that generates a reference signal such as a clock signal and is particularly a temperature-compensated crystal oscillator (TCXO). Such the oscillator 1 includes a resonation element 3, an inner package 2 (a first package) housing the resonation element 3, a circuit element 4 attached to the outer wall of the inner package 2, and an outer package 5 (a second package) housing the inner package 2 and the circuit element 4. In this way, by double sealing the resonation element 3 with the inner package 2 and the outer package 5, heat insulation increases, external heat is less likely to be transmitted to the resonation element 3, and the temperature change of the resonation element 3 may be reduced. Therefore, it is possible to realize the temperature compensation function by the circuit element 4 with high accuracy and to obtain the oscillator 1 having a stable temperature characteristic. Hereinafter, such the oscillator 1 will be described in detail.

Outer Package

As shown in FIG. 1, the outer package 5 includes a flat base 51 (a second base) having an upper surface 515 (one second main surface) and a bottom surface 516 (the other second main surface) opposed in the vertical direction, and a lid 52 (a second lid). More specifically, the outer package 5 includes a box-shaped base 51 having a recessed portion 511 that opens on the upper surface 515, the lid 52 joined to the upper surface 515 of the base 51 so as to close the opening of the recessed portion 511, and a seal ring 53 positioned between the base 51 and the lid 52 and joining the base 51 and the lid 52.

In addition, the recessed portion 511 includes a recessed portion 511a (primary second recessed portion) that opens on the upper surface 515 of the base 51 and a recessed portion 511b (secondary second recessed portion) that opens on the bottom surface of the recessed portion 511a. The lid 52 has a plate shape and is joined to the upper surface 515 of the base 51 via the seal ring 53 so as to close the opening of the recessed portion 511. The seal ring 53 has a frame shape and is positioned between the upper surface 515 of the base 51 and the lid 52. The seal ring 53 is made of a metal material, and the base 51 and the lid 52 are airtightly joined by melting the seal ring 53. A storage space S2 is formed by closing the opening of the recessed portion 511 with the lid 52, and the circuit element 4 and the inner package 2 are housed in the storage space S2.

The storage space S2 is an airtight space and is in a depressurized state, for example, which is replaced with an inert gas such as nitrogen, helium, or argon. As the depressurized state, the closer to vacuum is, the more preferable it is, for example, 10 Pa or less. In this way, it is possible to reduce the heat convection generated in the storage space S2 by setting the storage space S2 in a depressurized state. Therefore, heat outside the outer package 5 is less likely to be transmitted to the inner package 2 via the storage space S2, and as a result, it is difficult for external heat to be transmitted to the resonation element 3 and the circuit element 4. Therefore, the temperatures of the resonation element 3 and the circuit element 4 are stabilized. Furthermore, the temperature difference between the resonation element 3 and the circuit element 4 may also be kept small. Therefore, the temperature of the resonation element 3 may be accurately detected by a temperature sensitive element 421 of the circuit element 4, and it is possible to realize the temperature compensation function by the circuit element 4 with high accuracy and to obtain the oscillator 1 having a stable temperature characteristic. However, the atmosphere of the storage space S2 is not particularly limited and may be an atmospheric pressure, for example.

The constituent material of the base 51 is not particularly limited, but various ceramics such as aluminum oxide may be used, for example. In this case, the base 51 may be manufactured by firing the laminate of the ceramic sheets (green sheets). In addition, the constituent material of the lid 52 is not particularly limited, but various metal materials (including alloys), for example, may be used. Specifically, it is preferable that the lid 52 is a member having a coefficient of linear expansion close to that of the constituent material of the base 51. For example, in a case where the constituent material of the base 51 is ceramics as described above, it is preferable to use an alloy such as Kovar.

In addition, a plurality of internal terminals 513 are arranged on the bottom surface of the recessed portion 511a, and a plurality of external terminals 514 are arranged on a bottom surface 516 of the base 51. Each internal terminal 513 is electrically connected to the corresponding external terminal 514 via internal wiring (not shown) formed in the base 51. The number of the internal terminals 513 and the number of the external terminals 514 are not particularly limited and may be appropriately set depending on the number of the external terminals 214 of the inner package 2, for example.

Inner Package

As shown in FIG. 1, the inner package 2 includes a flat base 21 (a first base) having an upper surface 217 (one first main surface) and a bottom surface 216 (the other first main surface) opposed in the vertical direction, and a lid 22 (a second lid). More specifically, the inner package 2 includes a box-shaped base 21 having a recessed portion 211 that opens on the upper surface 217, the lid 22 joined to the upper surface 217 of the base 21 so as to close the opening of the recessed portion 211, and a seal ring 23 positioned between the base 21 and the lid 22 and joining the base 21 and the lid 22.

In addition, the recessed portion 211 includes a recessed portion 211a that opens on the upper surface 217 of the base 21 and a recessed portion 211b that opens on the bottom surface of the recessed portion 211a. The lid 22 has a plate shape and is joined to the upper surface 217 of the base 21 via the seal ring 23 so as to close the opening of the recessed portion 211. The seal ring 23 has a frame shape and is positioned between the upper surface 217 of the base 21 and the lid 22. The seal ring 23 is made of a metal material, and the base 21 and the lid 22 are airtightly joined by melting the seal ring 23. In this way, a storage space S1 is formed by closing the opening of the recessed portion 211 with the lid 22, and the resonation element 3 is housed in the storage space S1.

The storage space S1 is an airtight space and is filled with an inert gas such as nitrogen, helium, argon, or the like, for example. As a result, since the state of the storage space S1 is stabilized, the resonation characteristic of the resonation element 3 may be stabilized. In addition, heat convection occurs in the storage space S1, and therefore the thermal coupling between the resonation element 3 and the circuit element 4 is improved (thermal bonding is promoted) and the temperature difference between the resonation element 3 and the circuit element 4 may be suppressed to be smaller. However, the atmosphere of the storage space S2 is not particularly limited and may be in a depressurized state, for example. In the case of a depressurized state, it is preferable that the storage space S2 is in a state closer to vacuum (for example, 10 Pa or less).

The constituent material of the base 21 is not particularly limited, but various ceramics such as aluminum oxide may be used, for example. In this case, the base 21 may be manufactured by firing the laminate of the ceramic sheets (green sheets). In addition, the constituent material of the lid 22 is not particularly limited, but various metal materials (including alloys), for example, may be used. Specifically, it is preferable that the lid 22 is a member having a coefficient of linear expansion close to that of the constituent material of the base 21. For example, in a case where the constituent material of the base 21 is ceramics as described above, it is preferable to use an alloy such as Kovar.

In addition, a plurality of internal terminals 213 are arranged on the bottom surface of the recessed portion 211a, and a plurality of external terminals 214 and 215 are arranged on the bottom surface 216 of the base 21. Among the external terminals 214 and 215, the plurality of external terminals 214 are terminals for making electrical connection with the outer package 5, and the plurality of external terminals 215 are terminals for making electrical connection with the circuit element 4. Each external terminal 215 is electrically connected to the internal terminal 213 or the external terminal 214 via internal wiring (not shown) formed in the base 21.

Such the inner package 2 is housed in the storage space S2 with the bottom surface 216 (the surface on which the external terminals 214 and 215 are disposed) of the base 21 facing downward. The base 21 is fixed to the bottom surface of the recessed portion 511a via a plurality of metal bumps 55 (second metal bumps). In addition, the plurality of metal bumps 55 electrically connect the external terminals 214 of the inner package 2 and the internal terminals 513 of the outer package 5. That is, the inner package 2 and the outer package 5 are mechanically fixed and electrically connected by the plurality of metal bumps 55. The metal bump 55 is not particularly limited, and for example, a gold bump, a silver bump, a copper bump, a solder bump or the like may be used. In addition, the number of the metal bumps 55 is not particularly limited and may be appropriately set according to the number of the external terminals 214 and the internal terminals 513.

Here, since substantially no outgas is generated from the metal bumps 55, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 due to external heat. However, the material for fixing the inner package 2 to the outer package 5 is not limited to the metal bump 55, but may be a metal paste such as gold paste or silver paste, a conductive adhesive, or the like.

Resonation Element

As shown in FIG. 1, the resonation element 3 is housed in the inner package 2. As shown in FIGS. 2 and 3, the resonation element 3 includes a resonation substrate 31 and an electrode 32 disposed on the resonation substrate 31. The resonation substrate 31 is made of a piezoelectric material, and in particular, in the present embodiment, is made of quartz crystal. As a result, the resonation element 3 having an excellent frequency temperature characteristic may be obtained as compared with other piezoelectric materials.

The piezoelectric material is not limited to quartz crystal but may be lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium sodium niobate ($(K, Na) NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or the like, for example.

The resonation substrate 31 has a thickness shear resonation mode, and in the embodiment, is formed from an AT-cut quartz crystal substrate. As shown in FIG. 4, the AT-cut quartz crystal substrate is a "rotated Y-cut quartz crystal substrate" cut along a plane obtained by rotating an XZ plane around an X axis at an angle θ (=35° 15'). Since the AT-cut quartz crystal substrate has a third-order frequency temperature characteristic, the resonation element 3 having an excellent temperature characteristic may be obtained by forming the resonation substrate 31 from the AT-cut quartz crystal substrate. Hereinafter, an Y axis and a Z axis rotated about the X axis corresponding to the angle θ are referred to as an Y' axis and a Z' axis. That is, the resonation substrate 31 has a thickness in the Y' axis direction and is spread in an XZ' plane direction.

The electrode 32 includes an excitation electrode 321 disposed on the upper surface of the resonation substrate 31 and an excitation electrode 322 disposed on the lower surface so as to face the excitation electrode 321. In addition, the electrode 32 includes a pair of pad electrodes 323 and 324 disposed on the lower surface of the resonation substrate 31, a wiring 325 for electrically connecting a pad electrode 323 and the excitation electrode 321, and a wiring 326 for electrically connecting a pad electrode 324 and the excitation electrode 322. Then, the resonation substrate 31 is subjected to thickness shear resonation by applying a drive signal (alternating voltage) between the excitation electrodes 321 and 322.

As shown in FIG. 5, such the resonation element 3 is fixed to the bottom surface of the recessed portion 211a via a pair of joining members 26. In addition, one joining member 26 electrically connects the internal terminal 213 and the pad electrode 323, and the other joining member 26 electrically connects the internal terminal 213 and the pad electrode 324.

The joining member 26 is not particularly limited as long as the joining member 26 has both conductivity and bonding property, and for example, various metal bumps such as a gold bump, a silver bump, a copper bump, a solder bump, a conductive adhesive in which a conductive filler such as a silver filler is dispersed in various adhesives of polyimide type, epoxy type, silicone type, and acrylic type, or the like may be used. However, among these, it is preferable to use a conductive adhesive as the joining member 26. Thereby, the joining member 26 becomes comparatively soft, and resonation leakage of the resonation element 3 may be reduced.

Although the resonation element 3 has been described above, the configuration of the resonation element 3 is not limited to the above-described configuration. For example, the resonation element 3 may have a mesa shape in which the resonation region (region sandwiched between the excitation electrodes 321 and 322) of the resonation substrate 31 protrudes from the surroundings thereof, or on the contrary, may have an inverted mesa shape in which the resonation region is recessed from the surroundings. In addition, beveling for grinding the periphery of the resonation substrate 31 or convex processing with convex curved surfaces on the upper and lower surfaces may be applied. In addition, the resonation element 3 is not limited to resonation in the thickness shear resonation mode, and for example, a plurality of resonation arms may be flexural resonations (tuning fork resonations) in the in-plane direction, or the plurality of resonation arms may be flexural resonations (walking resonations) in the out-of-plane direction.

Circuit Element

As shown in FIG. 1, the circuit element 4 is housed in the storage space S2. In addition, the circuit element 4 is positioned between the bottom surface of the recessed portion 511b and the inner package 2. The circuit element 4 includes an active surface 43 on which a plurality of terminals 44 are arranged and is disposed such that the active surface 43 faces upward. The circuit element 4 is fixed to the bottom surface 216 of the base 21 of the inner package 2 via a plurality of metal bumps 25 (first metal bumps). In addition, each metal bump 25 electrically connects the terminal 44 and the external terminal 215. That is, the circuit element 4 and the inner package 2 are mechanically fixed and electrically connected by the plurality of metal bumps 25. The metal bump 25 is not particularly limited, and for example, a gold bump, a silver bump, a copper bump, a solder bump or the like may be used. The number of the metal bumps 25 is not particularly limited and may be appropriately set according to the number of the terminals 44 of the circuit element 4.

Here, since substantially no outgas is generated from the metal bumps 25, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 due to external heat. However, the material for fixing the circuit element 4 to the inner package 2 is not limited to the metal bump 25, but may be a metal paste such as gold paste or silver paste, a conductive adhesive, or the like.

In addition, the circuit element 4 includes an oscillation circuit 41 for oscillating the resonation element 3 to generate a frequency of a reference signal such as a clock signal and a temperature compensation circuit 42 for correcting the frequency of the reference signal generated by the oscillation circuit 41 based on the temperature of the resonation element 3. The temperature compensation circuit 42 is, for example, a circuit having a characteristic opposite to the temperature characteristic of the resonation element and is a circuit for obtaining a good temperature characteristic over a wide temperature range. The temperature compensation circuit 42 includes a temperature sensitive element 421 that detects the temperature of the resonation element 3 and corrects the frequency of the reference signal based on the output from the temperature sensitive element 421. Here, as described above, since both the resonation element 3 and the circuit element 4 are attached to the base 21, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421, and the circuit element 4 may realize an excellent temperature compensation function.

The temperature sensitive element 421 is not particularly limited, but in the embodiment, a temperature sensor utilizing the temperature dependence of the band gap voltage of the PN junction is used. As a result, it is easier to make the temperature sensitive element 421 in the circuit element 4, and it is possible to accurately detect the temperature of the resonation element 3.

The oscillator 1 of the embodiment has been described above. As described above, such the oscillator 1 includes the resonation element 3, the inner package 2 (first package) that houses resonation element 3 and is airtightly sealed, the circuit element 4 positioned outside the inner package 2 and electrically connected to the resonation element 3 and having the oscillation circuit 41 and the temperature compensation circuit 42, and the outer package 5 that houses the inner package 2 and the circuit element 4 and is sealed in a depressurized state. In addition, the inner package 2 (first package) includes the base 21 (first base) having two first main surfaces (the upper surface 217 and the bottom surface 216) and the recessed portion 211 (first recessed portion) provided on the upper surface 217 side, and the lid 22 (first lid) joined to the base 21 so as to close an opening of the recessed portion 211, and the outer package 5 (second package) includes the base 51 (second base) having two second main surfaces (the upper surface 515 and the bottom surface 516) and the second recessed portion 511 provided on the upper surface 515 side, and the lid 52 (second lid) joined to the base 51 so as to close an opening of the recessed portion 511. The circuit element 4 is attached to the base 21, and the base 21 is attached to the base 51.

According to such a configuration, since the external heat is transmitted to the resonation element 3 via the outer package 5 and the inner package 2, the heat transmission path from the outside to the resonation element 3 may be sufficiently lengthened. Furthermore, since the inside of the outer package 5 is depressurized, it is possible to reduce the heat convection generated in the outer package 5, thereby suppressing heat transmission other than heat conduction. Therefore, it is difficult for external heat to be transmitted to the resonation element 3, and temperature fluctuation of the resonation element 3 due to external heat may be reduced.

Furthermore, as described above, since both the circuit element 4 and the resonation element 3 are attached to the inner package 2, the thermal coupling between the resonation element 3 and the circuit element 4 is improved (thermal bonding is promoted) and the temperature difference between the resonation element 3 and the circuit element 4 may be suppressed to be smaller. Therefore, the temperature of the resonation element 3 may be accurately detected by the temperature sensitive element 421.

With the above effect, it is possible to realize the temperature compensation function by the circuit element 4 with high accuracy and to obtain the oscillator 1 having stable temperature characteristics. In particular, in the embodiment, since the inner package 2 and the outer package 5 are connected by the metal bumps 55, the heat transmission route from the outer package 5 to the inner package 2 may be made sufficiently small (thin). Therefore, external heat is less likely to be transmitted to the resonation element 3, and the above-described effect may be achieved more remarkably.

In addition, as described above, the oscillator 1 includes the metal bumps 25 (first metal bumps) that join the circuit element 4 and the base 21 and electrically connects the circuit element 4 and the inner package 2. In this way, the configuration of the oscillator 1 becomes simple by making mechanical connection and electrical connection between the circuit element 4 and the inner package 2 with the metal bumps 25. In addition, since substantially no outgas is generated from the metal bumps 25, the pressure in the storage space S2 may be kept lower. Therefore, it is possible to reduce the heat convection generated in the storage space S2 and to effectively reduce the temperature fluctuation of the resonation element 3 due to external heat.

In addition, as described above, the outer package 5 includes the internal terminal 513 disposed facing the inside of the recessed portion 511 and the external terminal 514 disposed on the bottom surface 516 (the other second main surface) of the base 51 and electrically connected to the internal terminal 513. As a result, it is easy to electrically extract from the inside to the outside of the outer package 5 and it is possible to easily make electrical connection to the circuit element 4 and the resonation element 3 from the outside of the outer package 5.

In addition, as described above, the oscillator 1 includes the metal bumps 55 (second metal bumps) that join the base 21 and the base 51 and electrically connects the inner package 2 and the internal terminal 513. In this way, the configuration of the oscillator 1 becomes simple by making mechanical connection and electrical connection between the inner package 2 and the outer package 5 with the metal bumps 55. In addition, since substantially no outgas is generated from the metal bumps 55, the pressure in the storage space S2 may be kept lower. Therefore, it is possible to reduce the heat convection generated in the storage space S2 and to effectively reduce the temperature fluctuation of the resonation element 3 due to external heat.

In addition, as described above, the circuit element 4 is disposed between the bottom surface of the recessed portion 511 and the base 21. It is possible to reduce the height of the oscillator 1 by disposing the circuit element 4 in this manner. In particular, in the embodiment, the recessed portion 511 includes a recessed portion 511a (primary second recessed portion) and a recessed portion 511b (secondary second recessed portion) that opens on the bottom surface of the recessed portion 511a. The base 21 is attached to the bottom surface of the recessed portion 511a, and the circuit element 4 is positioned between the base 21 and the bottom surface of the recessed portion 511b. By disposing the base 21 on the bottom surface of the recessed portion 511a in this manner, a space composed of the recessed portion 511b in which the circuit element 4 may be disposed may be formed below the base 21. Therefore, the circuit element 4 may be easily disposed between the base 21 and the bottom surface of the recessed portion 511.

In addition, as described above, the inside of the inner package 2 is filled with an inert gas. As a result, the atmosphere in the inner package 2 is stabilized and the resonation characteristic of the resonation element 3 may be stabilized. In addition, heat convection occurs in the inner package 2, and therefore the thermal coupling between the resonation element 3 and the circuit element 4 is improved (thermal bonding is promoted) and the temperature difference between the resonation element 3 and the circuit element 4 may be suppressed to be smaller. For that reason, it is possible to realize the temperature compensation function by the circuit element 4 with high accuracy and to obtain the oscillator 1 having stable temperature characteristics.

The configuration of the oscillator 1 is not limited to the configuration of the embodiment. For example, in the embodiment, the entire circuit element 4 is disposed on the bottom surface 216 (outside the first package 2) of the base 21, but at least apart of the circuit element 4 may be disposed on the bottom surface 216 of the base 21. More specifically, for example, the temperature sensitive element 421 made of a thermistor or the like may be provided separately from the circuit element 4, and the temperature sensitive element 421 may be disposed in the first package 2. Also, for example, the circuit element 4 may be separated into the oscillation circuit 41 and the temperature compensation circuit 42, the temperature compensation circuit 42 may be disposed on the bottom surface 216 of the base 21, and the oscillation circuit 41 may be disposed in another place (for example, inside the inner package 2), or vice versa.

Second Embodiment

Next, an oscillator according to a second embodiment of the invention will be described.

Figure 6:
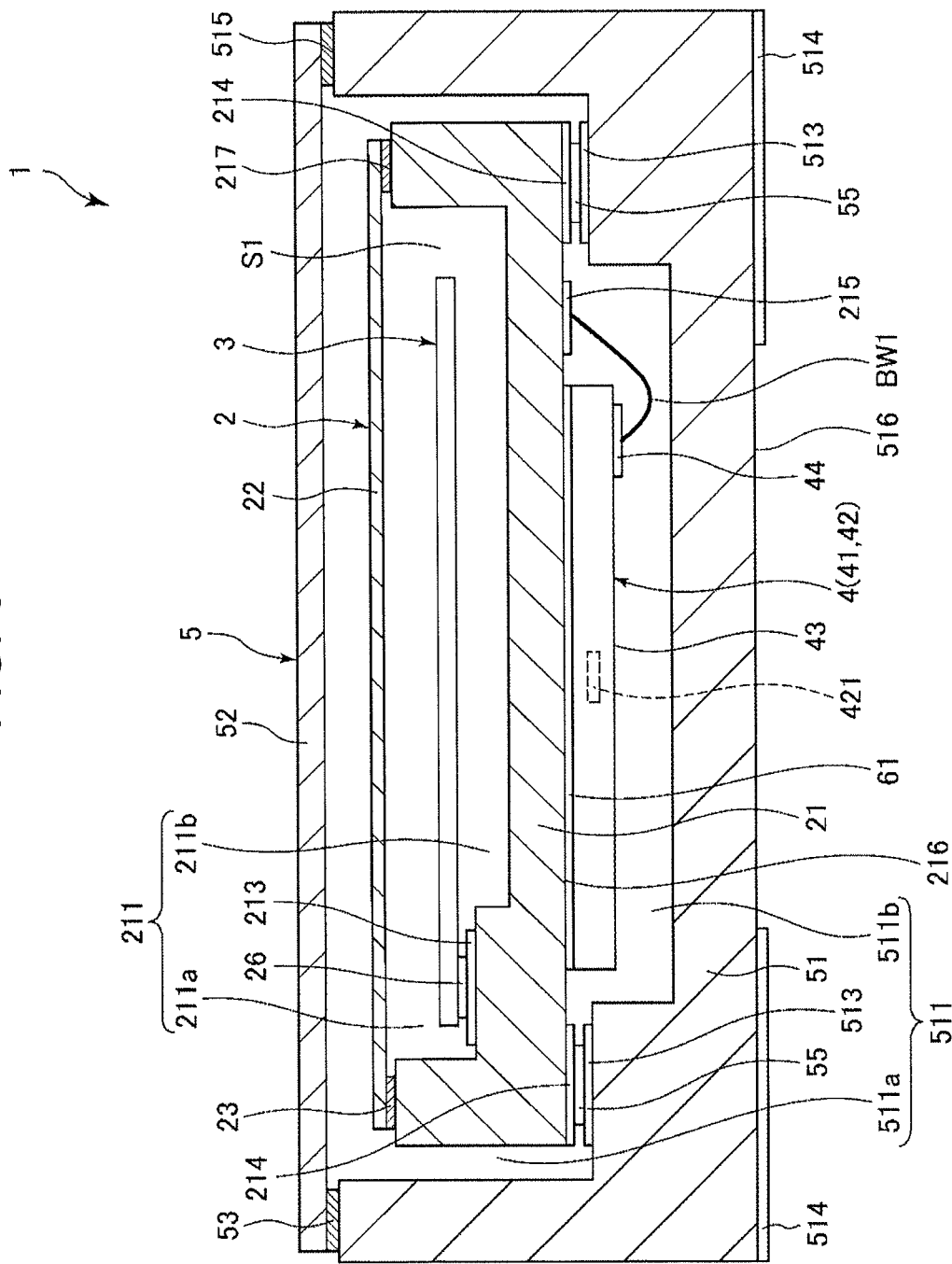
FIG. 6 is a cross-sectional view of an oscillator according to a second embodiment of the invention.

FIG. 6 is a cross-sectional view of the oscillator according to the second embodiment of the invention.

Hereinafter, differences between the oscillator of the second embodiment and the above-described embodiment will be mainly described, and description of similar matters will be omitted. The oscillator of the second embodiment is similar to the oscillator of the first embodiment except that the direction of the circuit element 4 is mainly different. In FIG. 6, the same reference numerals are given to the same configurations as in the above-described embodiment.

As shown in FIG. 6, in the oscillator 1 of the embodiment, the circuit element 4 is housed in the storage space S1 such that the active surface 43 faces downward (the bottom surface side of the recessed portion 511b). In addition, the circuit element 4 is fixed to the bottom surface of the base 21 of the inner package 2 via the joining member 61. The terminal 44 of the circuit element 4 and the external terminal 214 of the inner package 2 are electrically connected via a bonding wire BW1.

The joining member 61 is not particularly limited, and various adhesives such as an epoxy type adhesive and a silicone type adhesive, various metal pastes such as a solder, a gold braze, a silver braze, or the like may be used, for example. However, as the joining member 61, it is preferable to use a metal paste. In addition, since substantially no outgas is generated from the metal base, the pressure in the storage space S2 may be maintained at a lower level (increase in pressure over time may be suppressed). Therefore, it is possible to reduce the heat convection generated in the storage space S2 and to effectively reduce the temperature fluctuation of the resonation element 3 due to external heat.

As described above, the oscillator 1 of the embodiment includes the joining member 61 that bonds the circuit element 4 and the base 21, and the bonding wire BW1 that electrically connects the circuit element 4 and the inner package 2. According to such a configuration, it is possible to easily perform mechanical fixing between the circuit element 4 and the inner package 2 and electrical connection between the circuit element 4 and the inner package 2.

According to the second embodiment like this, the same effects as those of the first embodiment described above may be achieved.

Third Embodiment

Next, an electronic apparatus according to a third embodiment of the invention will be described.

Figure 7:
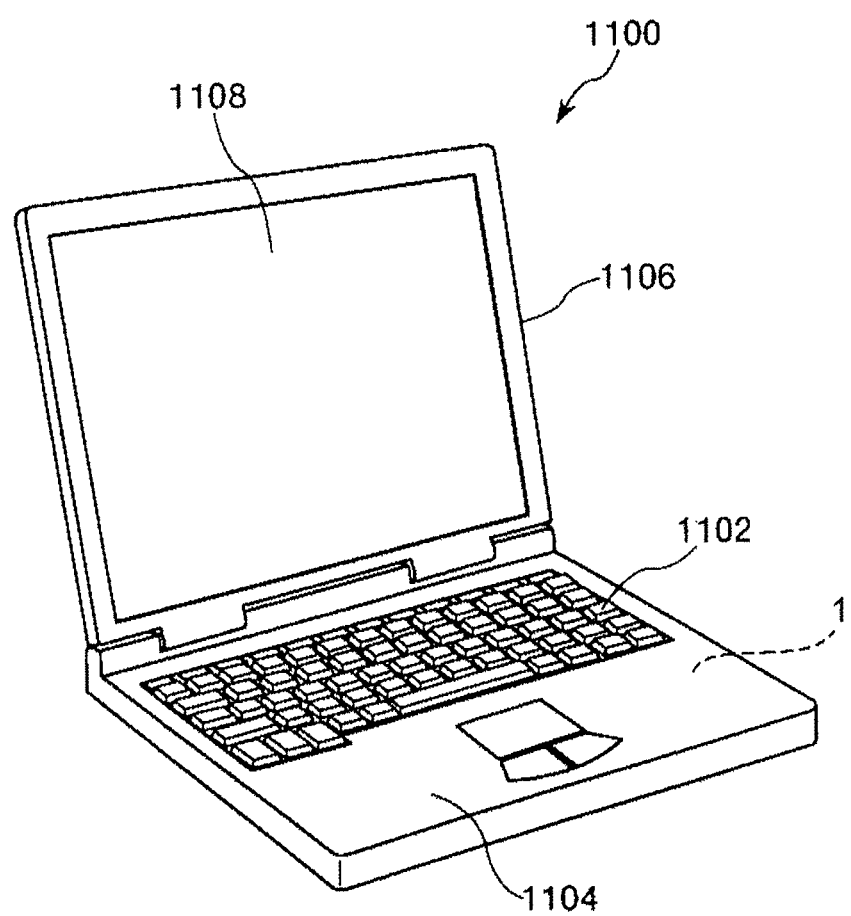
FIG. 7 is a perspective view showing an electronic apparatus according to a third embodiment of the invention.

FIG. 7 is a perspective view showing the electronic apparatus according to the third embodiment of the invention.

A mobile type (or notebook type) personal computer 1100 shown in FIG. 7 is one to which an electronic apparatus including the oscillator according to the invention is applied. In this diagram, the personal computer 1100 is configured by a main body 1104 having a keyboard 1102 and a display unit 1106 having a display portion 1108, and the display unit 1106 is rotatably supported relative to the main body 1104 via a hinge structure. In addition, in the personal computer 1100, for example, the oscillator 1 used as an oscillator is incorporated.

Such the personal computer 1100 (electronic apparatus) has the oscillator 1.

Therefore, it is possible to achieve the effect of the above-described oscillator 1 and high reliability.

Fourth Embodiment

Next, an electronic apparatus according to a fourth embodiment of the invention will be described.

Figure 8:
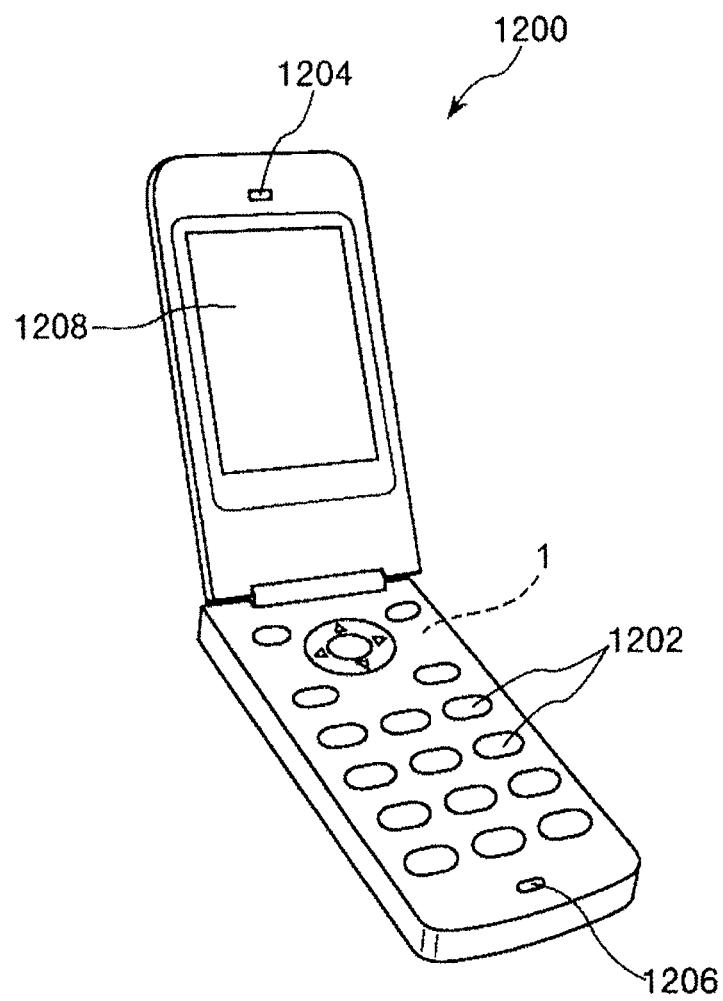
FIG. 8 is a perspective view showing an electronic apparatus according to a fourth embodiment of the invention.

FIG. 8 is a perspective view showing the electronic apparatus according to the fourth embodiment of the invention.

A mobile phone 1200 (including the PHS) shown in FIG. 8 is one to which an electronic apparatus including the oscillator according to the invention is applied. The mobile phone 1200 includes an antenna (not shown), a plurality of operation buttons 1202, an earpiece 1204, and a mouthpiece 1206, and a display unit 1208 is disposed between the operation buttons 1202 and the earpiece 1204. In addition, the mobile phone 1200 incorporates, for example, the oscillator 1 used as an oscillator.

The mobile phone 1200 (electronic apparatus) as described above has the oscillator 1. Therefore, it is possible to achieve the effect of the above-described oscillator 1 and high reliability.

Fifth Embodiment

Next, an electronic apparatus according to a fifth embodiment of the invention will be described.

Figure 9:
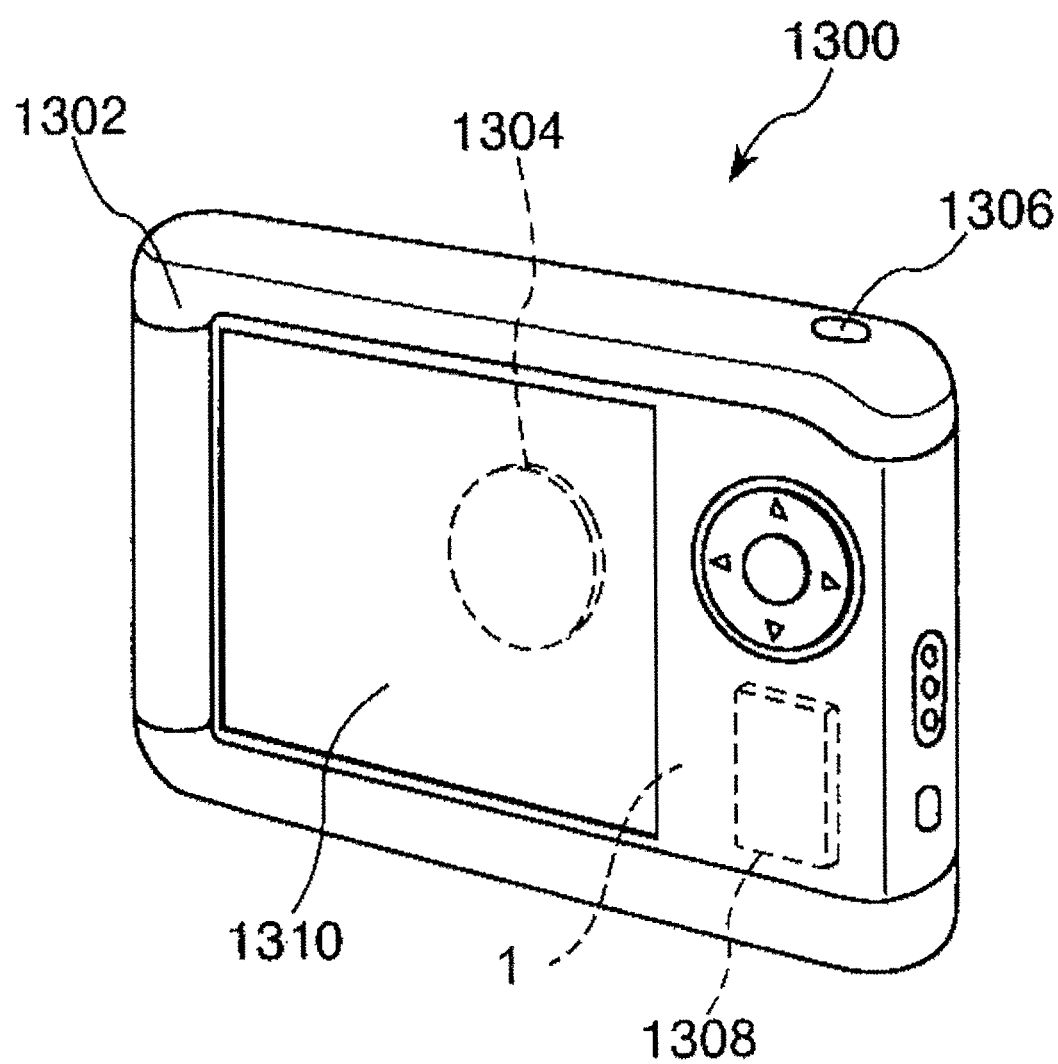
FIG. 9 is a perspective view showing an electronic apparatus according to a fifth embodiment of the invention.

FIG. 9 is a perspective view showing the electronic apparatus according to the fifth embodiment of the invention.

A digital still camera 1300 shown in FIG. 9 is one to which an electronic apparatus including the oscillator according to the invention is applied. A display unit 1310 is provided on the back surface of a case (body) 1302 and is configured to perform display based on imaging signals by a CCD, and the display unit 1310 functions as a finder that displays a subject as an electronic image. In addition, alight receiving unit 1304 including an optical lens (imaging optical system) and a CCD or the like is provided on the front side (back side in the drawing) of the case 1302. When a photographer confirms the subject image displayed on the display unit 1310 and presses a shutter button 1306, the imaging signal of the CCD at that time is transferred and stored in a memory 1308. In addition, the digital still camera 1300 incorporates the oscillator 1 used as an oscillator.

Such the digital still camera 1300 (electronic apparatus) includes the oscillator 1. Therefore, it is possible to achieve the effect of the above-described oscillator 1 and high reliability.

In addition to the personal computer, the mobile phone, and the digital still camera of the embodiments described above, the electronic apparatus according to the invention may be applied to, for example, a smartphone, a tablet terminal, a clock (including a smart watch), an ink jet type discharging device (for example, an ink jet printer), a laptop type personal computer, a television, a wearable terminal such as an head mounted display (HMD), a video camera, a video tape recorder, a car navigation device, a pager, an electronic notebook (including a communication function), an electronic dictionary, a calculator, an electronic game machine, a word processor, a workstation, a TV phone, a security TV monitor, electronic binoculars, a POS terminal, medical equipment (for example, electronic clinical thermometer, blood pressure monitor, blood glucose meter, electrocardiogram measuring device, ultrasonic diagnostic device, electronic endoscope), a fish finder, various measuring instruments, mobile terminal base station equipment, instruments (for example, instruments of vehicles, aircraft, ships), a flight simulator, a network server, and the like.

Sixth Embodiment

Next, a moving body according to a sixth embodiment of the invention will be described.

Figure 10:
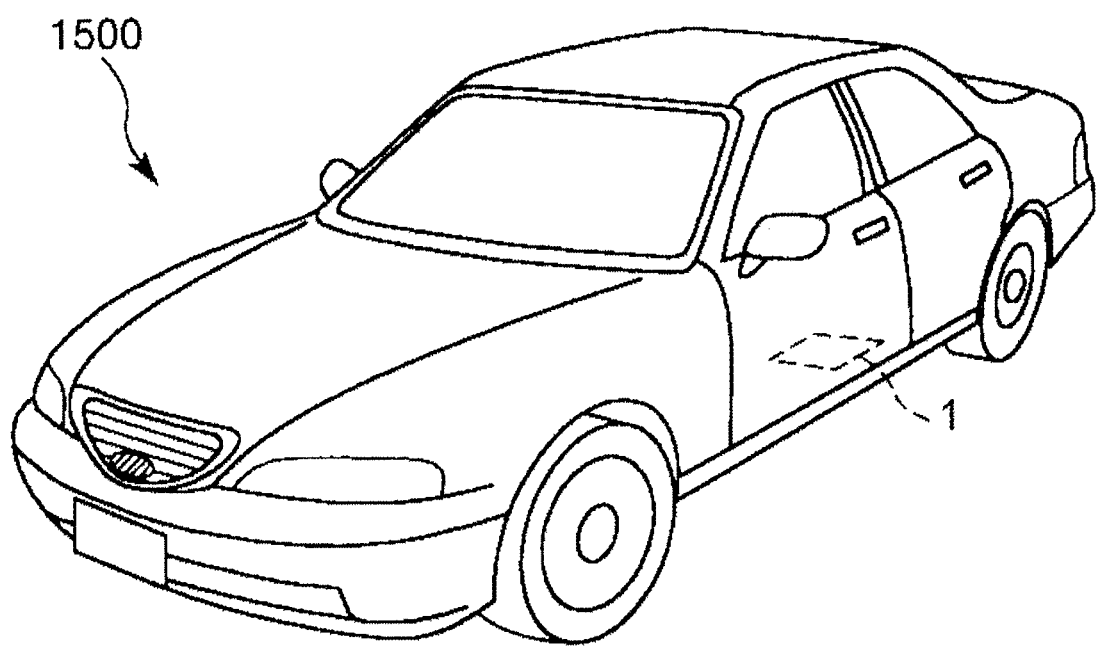
FIG. 10 is a perspective view showing a vehicle according to a sixth embodiment of the invention.

FIG. 10 is a perspective view showing a vehicle according to the sixth embodiment of the invention.

An automobile 1500 shown in FIG. 10 is a vehicle to which a moving object equipped with the oscillator according to the invention is applied. In the automobile 1500, for example, the oscillator 1 used as an oscillator is incorporated. The oscillator 1 may be widely applied to, for example, keyless entry, immobilizer, car navigation system, car air conditioner, anti-lock brake system (ABS), air bag, tire pressure monitoring system (TPMS), engine control, battery monitor for hybrid cars and electric cars, and electronic control unit (ECU) such as a vehicle body attitude control system.

Such the automobile 1500 (moving object) includes the oscillator 1. Therefore, it is possible to achieve the effect of the above-described oscillator 1 and high reliability.

The moving object is not limited to the automobile 1500 but may also be applied to unmanned airplanes such as an airplane, a ship, an automated guided vehicle (AGV), a biped walking robot, a drone, and the like.

The oscillator, the electronic apparatus, and the vehicle according to the invention have been described based on the illustrated embodiments, but the invention is not limited thereto, and the configuration of each portion may be replaced with an arbitrary configuration having the same function. In addition, other optional components may be added to the invention. In addition, the invention may be a combination of arbitrary two or more configurations (features) of the above embodiments.

The entire disclosure of Japanese Patent Application No. 2018-035891, filed Feb. 28, 2018 is expressly incorporated by reference herein.

What is claimed is:
1. An oscillator comprising:
a resonation element;

a first package that houses the resonation element and is airtightly sealed;
a circuit element that
  has an active surface,
    is positioned outside the first package and electrically connected to the resonation element, and
  has an oscillation circuit and a temperature compensation circuit; and
a second package that houses the first package and the circuit element and is sealed in a depressurized state, wherein:
the first package includes
  a first base that has two first main surfaces and a first recessed portion that is provided on one of the first main surfaces, and
  a first lid that is joined to the first base so as to close an opening of the first recessed portion,
the second package includes
  a second base that has two second main surfaces and a second recessed portion that is provided on one of the second main surfaces, and
  a second lid that is joined to the second base so as to close an opening of the second recessed portion,
the active surface of the circuit element is attached to the first base via a first metal bump that electrically connects the circuit element and the first package,
the active surface, except a part attached to the first base via the first metal bump, is separated apart from the first base and is exposed to an atmosphere inside the second package, and
the first base is attached to the second base.

2. The oscillator according to claim 1, comprising:
a joining member that joins the circuit element and the first base.

3. The oscillator according to claim 1, wherein
the second package includes
  an internal terminal that is disposed so as to face an inside of the second recessed portion, and
  an external terminal that is disposed on the other second main surface of the second base and electrically connected to the internal terminal.

4. The oscillator according to claim 3, further comprising:
a second metal bump that joins the first base and the second base and electrically connects the first package and the internal terminal.

5. The oscillator according to claim 3,
wherein the circuit element is disposed between a bottom surface of the second recessed portion and the first base.

6. The oscillator according to claim 5, wherein
the second recessed portion includes
  a primary second recessed portion, and
  a secondary second recessed portion that opens on a bottom surface of the primary second recessed portion,
the first base is attached to the bottom surface of the primary second recessed portion, and
the circuit element is positioned between the first base and a bottom surface of the secondary second recessed portion.

7. The oscillator according to claim 1,
wherein an inside of the first package is filled with an inert gas.

8. An electronic apparatus comprising:
the oscillator according to claim 1.

9. A vehicle comprising:
the oscillator according to claim 1.

* * * * *